United States Patent
Marinissen et al.

(10) Patent No.: US 6,829,736 B1
(45) Date of Patent: Dec. 7, 2004

(54) METHOD OF TESTING A MEMORY

(75) Inventors: Erik Jan Marinissen, Eindhoven (NL);
Guillaume Elisabeth Andreas Lousberg, Eindhoven (NL); Paul Wielage, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 593 days.

(21) Appl. No.: 09/831,657

(22) PCT Filed: Sep. 8, 2000

(86) PCT No.: PCT/EP00/08848
§ 371 (c)(1),
(2), (4) Date: May 11, 2001

(87) PCT Pub. No.: WO01/20614
PCT Pub. Date: Mar. 22, 2001

(30) Foreign Application Priority Data

Sep. 15, 1999  (EP) .............................. 99203002

(51) Int. Cl.$^7$ .............................. H03M 13/00
(52) U.S. Cl. .................................... 714/711
(58) Field of Search ................ 714/710, 711, 714/7, 718

(56) References Cited

U.S. PATENT DOCUMENTS

| | | | | |
|---|---|---|---|---|
| 5,317,573 A | * | 5/1994 | Bula et al. | 714/711 |
| 5,337,318 A | | 8/1994 | Tsukakoshi et al. | 714/708 |
| 6,032,264 A | * | 2/2000 | Beffa et al. | 714/7 |

* cited by examiner

*Primary Examiner*—Shelly A Chase
(74) *Attorney, Agent, or Firm*—Michael J. Ure

(57) ABSTRACT

A built-in self-diagnostic (BISD) memory device includes a two-dimension memory array provided with a redundant memory rows and columns that can be substituted for various ones in the two-dimension memory array by an external repair facility. A stimulus generator outputs multi-address test sequences to the memory array during a test mode. A response evaluator receives responses from the memory. A fault table stores evaluations of the responses, and communicates them to the external repair facility. A repair register indicates which memory columns have been intermediately scheduled for repair by the response evaluator. Column counters each accumulate the number of memory bit faults detected in a respective memory column. All are disposed in a single integrated circuit semiconductor device.

6 Claims, 4 Drawing Sheets

```
search in table for current word line address;
if not found {
        if table not full {
                add word line address and fault word to table;
        }
        else {
                RAM not repairable; abort;
        }
else {
        increment counters for those bits where fault word OR (table entry) = 1;
        replace table entry by table entry AND NOT fault word;
}
```

METHOD OF TESTING A MEMORY

FIELD OF THE INVENTION

The invention relates to a method for testing a memory array with row and column redundancy whilst keeping track of row-wise and column-wise must repair occurrencies, and a memory-based device arranged for practicing such method.

BACKGROUND OF THE INVENTION

Integrated-circuit memory chips have been growing in size over the years. Large memories, and in particular DRAMs, have suffered from low manufacturing yields. It has become common practice to provide such with spare rows and columns so that after testing these may be used as replacements. In common manufacturing practice, a 2% redundancy may triple manufacturing yield. Testing of memory arrays has become a refined art, based on presenting the array with many test stimuli with a prescribed content and in a prescribed sequence, and subsequently reading the stored content for comparison with the expected response. The combination of stimulus and expected response is often called the test pattern.

Of late, processor or other circuitry has been combined with a large amount of so-called embedded memory. The nature of such other circuitry is not critical to the present invention. For digital processing, the combination often allows a larger communication bandwidth between memory and the other circuitry, than between the memory if stand alone and the environment, both in terms of the number of wires, and in terms of bit rate per wire. In various aspects, the other circuitry would isolate the memory from the chip's surroundings. The embedded array often has more I/O bit terminals than the combination has available data pins. Hence, direct access to the array is often unfeasible. Restricting the test to an inexpensive on-chip pass/fail determination, such as through a signature-generating mechanism, would not allow to execute repair operations.

By itself, the repair poses a so-called NP-Hard Problem. The problem is to determine, for a given set of faulty bit locations in the memory, and furthermore, for given numbers of spare rows and columns, respectively, the following: whether the memory is repairable, and if so: which faulty rows and/or columns should effectively be repaired This problem is NP-Hard inasmuch as the time complexity for finding an optimum solution is exponential in the number of spare rows and in the number of spare columns. Fortuitously, in most practical cases it is tractable due to the relatively small numbers of repair rows and repair columns involved, provided only that the full fault bit map is known. The repair strategy may thus be handled off-chip. However, due to the large number of test patterns required, parallel-to-serial conversion of the complete response patterns for external verification would appreciably slow down the execution of the test. On the other hand, storing the complete fault pattern on-chip would need a second memory of the same size as the memory under test, as well as an appreciable and expensive amount of strategy-determining logic.

Now, a particular aspect of mass testing of memory is not only to pinpoint the rows and columns that should be repaired, but also to keep track of the amount of repair necessary, and to signal as early as possible when repair capability is exceeded. Such is difficult, because a particular bit fault may be part of a row to be replaced, of a column to be replaced, or of both. During the test, optimum assignment may even change due to later detected faults.

Therefore, an improved trade-off should require only moderate extensions of the on-chip facilities, while at the other hand necessitating only little communication with the external world, whilst still providing a losslessly compressed response pattern. In particular, on-chip storage space should be kept very low. Also, the loss in manufacturing yield should be low.

SUMMARY TO THE INVENTION

In consequence, amongst other things it is an object of the present invention to provide a methodology for dynamically assessing the configuration of faults already detected to at least in part and for economically assigning the faults to repair facilities that are present according to a Must Repair Strategy, and to signal in an early manner when overall repairability cannot be guaranteed any longer.

Now therefore, according to one of its aspects, the invention is characterized according to the characterizing part of claim 1. The invention also relates to a memory-based device being arranged for implementing a method as claimed in claim 1. Further advantageous aspects of the invention are recited in dependent Claims.

U.S. Pat. No. 5,337,318 describes a method for tallying both rows and columns in a memory array that must be repaired, and in consequence may signal occurrence of non-repairability. The present invention however allows dynamical assignment of certain faults to either a redundant column or to a redundant row for better usage of overall repair facilities.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
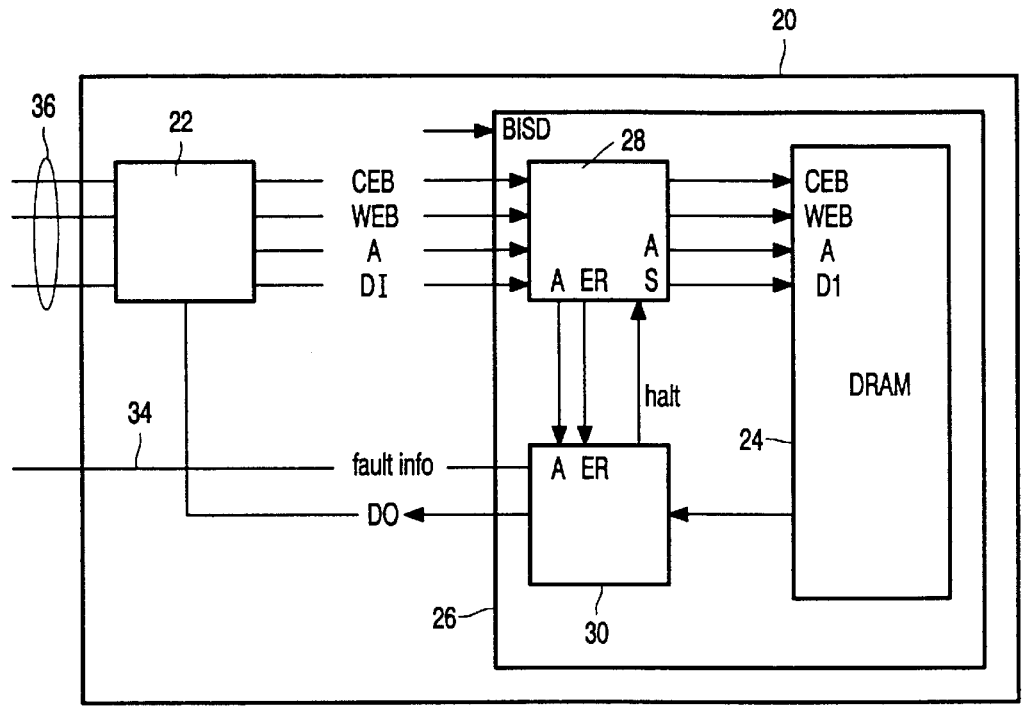
FIG. 1, an integrated circuit architecture embodying the present invention.

FIG. 1 shows an embodiment of an integrated circuit architecture embodying the present invention. The integrated circuit chip 20 has been provided with external pins or bonding pads shown as bundle 36, which may comprise digital data, analog signals, control, and power channels arranged in various sub-bundles of appropriate path width and amplitude ranges. Hereinafter, various power and control interconnections are considered standard, and will not be disclosed in detail. The same applies to the operation of various basic electronic memory features. Now often, a relatively large part of the chip area is used by memory 24, that may be based on various technologies, such as DRAM or SRAM.

Block 22 symbolizes in the broadest sense circuitry "other than the memory to be tested" and may comprise processor functionality and/or other memory or non-memory functionality of any applicable nature, such as single-purpose sequential logic circuitry, analog signal handling, programmable logic array, and other that is generally not based on a layout from uniform cells as memory. The memory under test may be distributed over a plurality of physically and/or logically distinct arrays, which feature has not been shown for clarity.

Now, in non-test condition of the embodiment, functionality 22 converses with memory 24, in that blocks 28, 30 are controlled in a transparent mode, so that the signals Chip Enable Bar CEB, Write Enable Bar WEB, Address A, Data In DI, and Data Out DO travel substantially unimpeded. Other embodiments of such signals would be feasible. Block 22 communicates unidirectional and/or bi-directional data and control signals with external circuits not shown on bundle 36, which communication will generally be governed by the inherent facilities provided in block 22. Furthermore, line 34 communicates fault info, that may also run through block 22. In the art, the phrase Built-In-Self-Test BIST means that testing provides Pass/Fail data, the phrase Built-In-Self-Diagnosis BISD means that testing points to the actually found faults, whereas Built-In-Self-Repair BISR has also the repair executed in-chip, thereby obviating the need for providing external pointers. The present invention is directed to a BISD scheme.

Now, it is generally expensive to connect all test response lines immediately to an environment. Therefore, the present invention provides the adding of a relatively small amount of hardware and control that may be used to analyze fault patterns upon the finding thereof to dynamically at least partially assign such faults to appropriate redundancy available. The strategy is to combine the low-level test steps with a partial on-chip analysis, the results of which need only a small amount of storage. Next, the small-size results are outputted for further analysis off-chip. The outputting needs little time, and the off-chip processing can be done in hardware and software that are not subject to the size restrictions that are imposed on the chip itself.

Now, memory 24 has been provided with BISD functionality located in block 26 in particular through blocks 28 and 30. Various features of the present invention distinguish in advantageous manner. It should be noted that the present test methodology is directed to mass testing that must pinpoint all detected faults while needing only little overhead in chip area as well as in test time. The present invention allows to continue testing automatically once a particular fault signalization has been fully analyzed. All available fault data can be automatically signalled to an external device, regardless of the actual internal spacing between various faults occurred. The facilities used are extremely restricted if not minimal. Finally, the present invention uses a dynamic approach for fault assigning, in that part of the decision is delayed. Furthermore, the invention provides for signalling irrepairability.

Figure 1A:
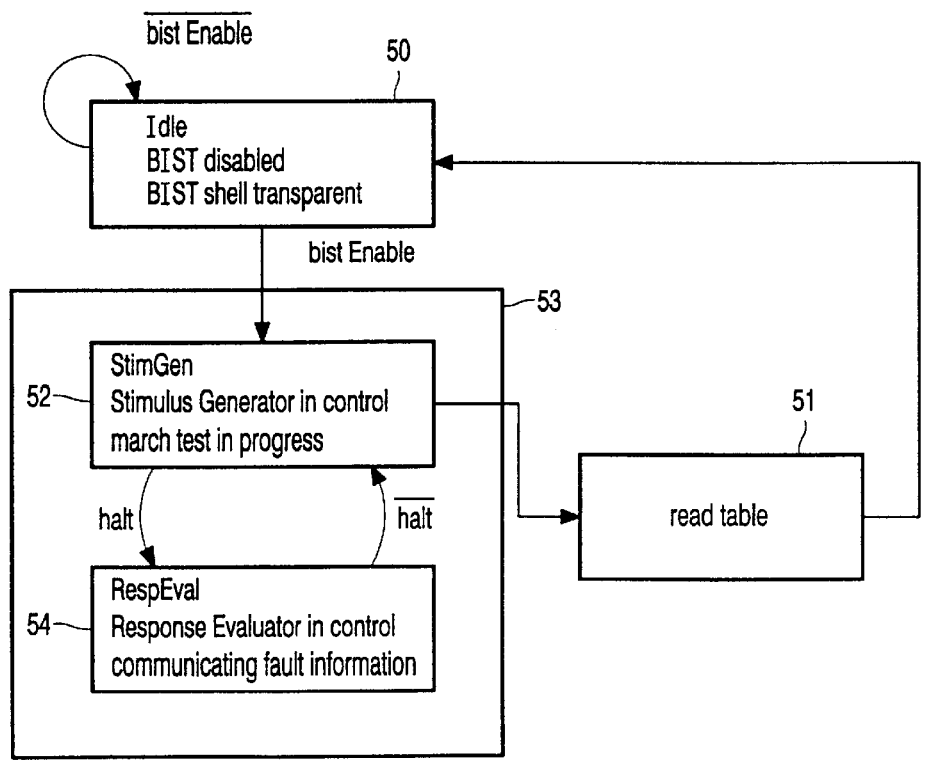
FIG. 1A, the operation modes of the architecture of FIG. 1.

FIG. 1A shows the operation modes of the architecture of FIG. 1. In block 50, control signal bistEnable controls the normal mode of operation: the BIST is idling, the various active items of the BIST are disabled, and the BIST shell is transparent, notably blocks 28 and 30, so that only little influence is effected on the signal transfer. This state may prevail for a long time, in particular after the manufacturing test procedures have been terminated. Actuation of the bistEnable signal steers the system to the Test Process of block 53. The test proper alternates between two modes of operation 52, 54. In the mode StimGen 52, Stimulus Generator 28 is in control, and the memory test is in progress, such as according to a so-called March Test or another applicable methodology. This test produces a sequence of address A and data in DI pairs that are presented to memory 24, to eventually result in a corresponding sequence of data out DO from memory 24. Moreover, Stimulus Generator 28 sends the address A and an associated expected response ER to Response Evaluator 30. Generally although not restrictively, the expected response ER is identical to an associated data DI that had most recently been written into the memory location associated to this address. Note that a sequence of DI words for a series of addresses may be mutually identical.

Now, data out DO received in block 30 from memory 24 are in the mode RespEval 54 compared with the appropriate data. In this respect, a complete multi-address test sequence will be disclosed with respect to FIG. 2. Now, as long as the comparison does not find a discrepancy between the Data Out and the expected response therefor, the halt signal from Response Evaluator 30 remains nonasserted, and the next test cycle proceeds. However, if the comparison does indeed find a discrepancy, the halt signal from Response Evaluator 30 becomes asserted, and the next test cycle remains suspended. In block 54, the fault is evaluated as will hereinafter be disclosed with reference to FIG. 3. This information may be used eventually outside chip 20, for then controlling a physical repair process, such as by fuse blowing. If the evaluation in block 54 is finished, the halt signal is deasserted again, so that the testing can continue in its prespecified manner. The present invention does not specify a physical address sequence or the content of a test pattern, as such is particular to the specific test applied. Eventually, the test will be complete, and the system will exit from the test block 53.

Figure 5:
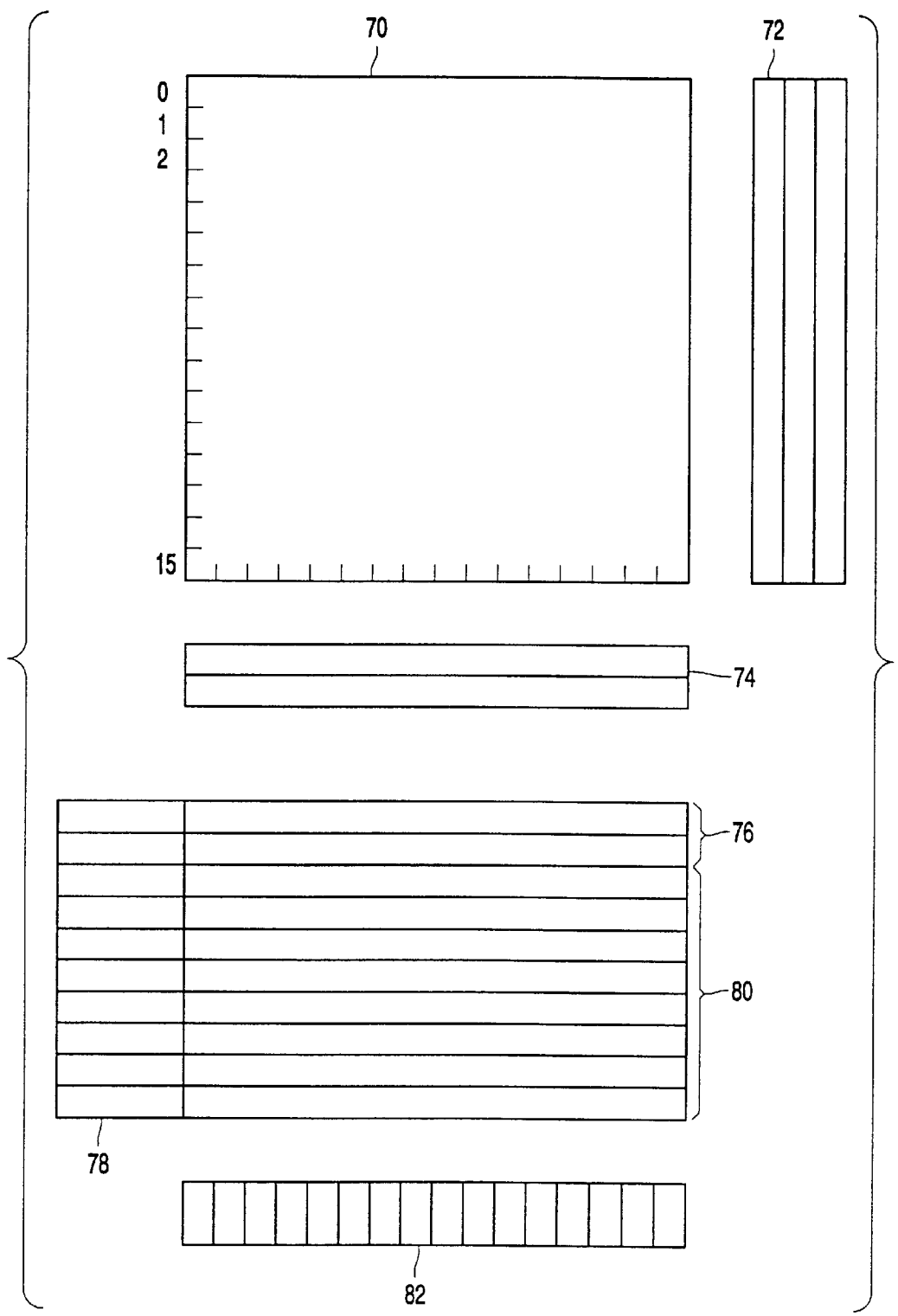
FIG. 5 is a block diagram of repair analysis hardware.

Thereupon, the result from the evaluation as stored in the Table of FIG. 5, will be read out, and communicated to an external analysis and repair device not shown herein. Communication may be performed via wire 34, via one or more wires of bundle 36, or otherwise. The external device will now know enough about the various faults detected to decide whether and what repair measures should be taken. By itself, the policy of such machine is not subject of the present invention, as such machine would be able to operate in the same manner, given the memory bit faults immediately upon detection thereof. After the communication with the external device has been executed, the system of FIG. 1A may proceed again to block 50.

Figure 2:
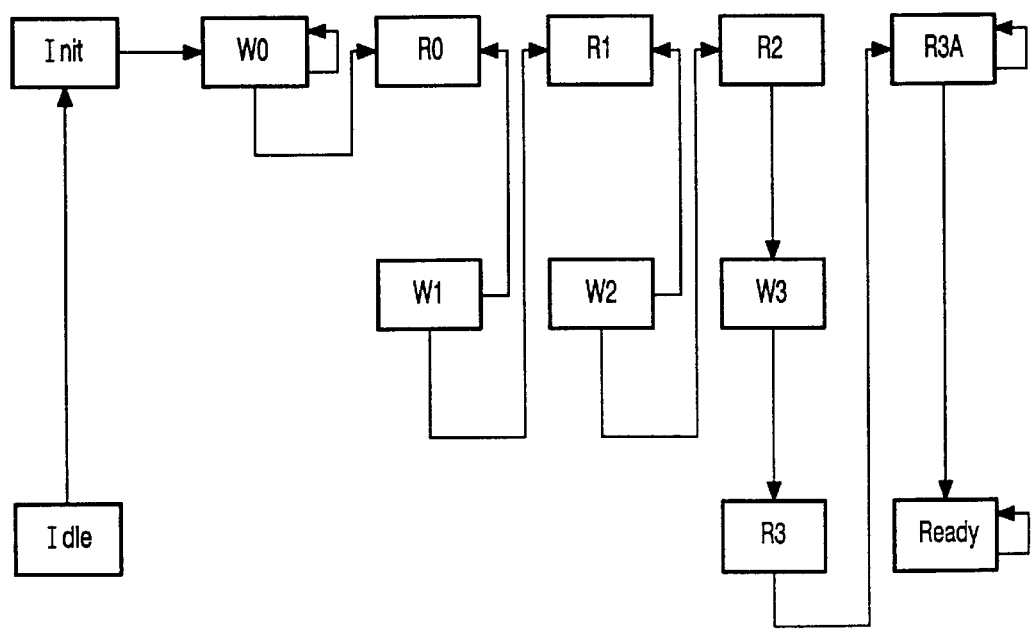
FIG. 2, a finite state machine organized for executing a 9N March Memory Test.

FIG. 2 shows a finite state machine embodiment organized for executing a 9N March Memory Test. For simplicity, only the various states have been shown. After Initialization, words with content W0 are written in a sequence of cycles, usually for all applicable addresses, each cycle pertaining to a single word location. Next, a sequence of locations is read in action R0, pertaining to all or to a fraction of those written earlier, to intentionally produce word W0 again, whilst in the same addressing operation cycle writing word W1 into the word location in question. These read/write cycles are then executed once more for a third data content, indicated as R1/W2. Next, these cycles are executed once more for a fourth data content according to R2/W3, the latter being read again immediately after writing without further address changing, as indicated by R3. Next, all words are read once more as indicated by R3A, for checking the actually stored content. This is the last step to arrive at 9 steps per address location. The diagram is completed with a Ready state and with an Idle state. The 9N march test schedule is one of several schemes in common use, and the present invention is not directed to such scheme in particular. In fact, the invention is likewise applicable if the addressing sequence were changed, if it were different during reading from writing, and if successive data words in a sequence were mutually different.

Figures 3, 4:
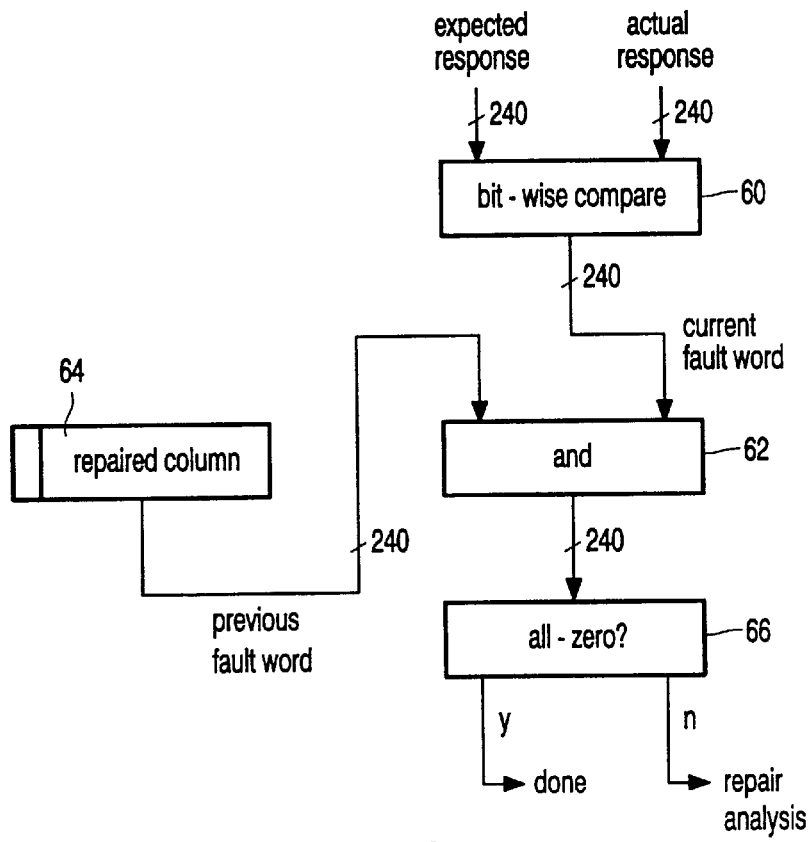
FIG. 3, a response evaluator embodiment.
FIG. 4, represents a repair analysis procedure.

FIG. 3 shows a response evaluator embodiment for use with the present invention. For simplicity, synchronization or other applicable control of the circuitry has not been shown. At the top of the Figure, the expected response pattern and actual response pattern in the current embodiment both have a length of 240 bits, and for attaining a high speed are bit by bit compared in parallel in block 60. The comparison produces for the embodiment a 240 bit current fault word that in block 62 is bitwise ANDED with the "repaired bits information fault word" for the actual address, that is a map of all faults that have been detected and stored in the fault table of FIG. 5. If no faults had been found yet for the current word, the comparison is a dummy operation. If the previous fault word was non-zero, in block 66 the ANDED vector is checked for an all-zero pattern. If yes, the halt signal remains non-asserted at "0", and the testing continues. If the check does not detect an all-zero pattern, a repair analysis is executed as will be disclosed infra. It would be clear that the analysis result will only be outputted in relatively infrequent situations. Note furthermore, that non-detecting a fault for a single address and pattern may still result from a fault that remains undetected for the pattern in question, such as a stuck-at fault.

The procedure according to the foregoing may be further extended as follows. Because lossless compressed response signalization patterns may occur in long strings, the tester will then for a predetermined period receive only a single bit per clock cycle. Even if some faults will be actually detected, the overall run will take only little more time than the minimum. It is possible to estimate this extra time for various fault patterns that are just repairable, and thereby estimate the maximally feasible test time. Now, memories of which the BIST procedure did not complete within such estimated time length may be considered unrepairable, so that the test in question may be aborted and the circuit be scrapped. For simplicity, this extra check has not been shown in the diagrams. The choice of the maximum run length is a relevant parameter. Memory design should specify a range of maximally. repairable fault patterns, each pattern combined with the resulting signalization bit length. The maximum value of this length, at a certain risk for being too pessimistic, may specify a somewhat lower value, such as 10% lower, and should apply for setting the above described maximum threshold signalization length. Note that anyway, the length of the overall signalization may not exceed the memory capacity of the external tester.

A further feature is the defect-oriented address ordering. This feature is based on the fact that for March Testing the logic address ordering can in principle be arbitrary. This degree of freedom may be used to choose an address sequence in such manner that many successive addresses will have the same fault pattern. The choosing may be done without knowing the actual faults. For example, because bitline faults will generally be the most likely ones, the address order of a March Test may be chosen such that the test marches successively along the addresses that share physical bit lines of the memory. Note that the physical address within the memory array(s) need not be identical to the logical address given by the address bits. In case of a failing bit line, this will then lead to communicating only a single full response signalization for that particular bit line failure. In particular, it has been found that for certain memory technologies, column errors will have the greatest probability.

FIG. 4 presents a repair analysis procedure in pseudocode form. Thereto, FIG. 5 is a block diagram of on-chip analysis hardware that does a partial repair analysis. Therein, item 70 is the memory array proper, that in this embodiment has sixteen rows of sixteen bits each. In common practice, it would be much larger, thus diminishing the relative amount of redundancy. For further enhancing clarity, various addressing and synchronizing mechanisms, as well as the necessary data paths have been suppressed in the arrangement of FIG. 5. The memory array has three redundant columns 72 and two redundant rows 74, which numbers in practice are often greater.

Next, the embodiment has a must repair table 76, that has $r*(c+1)$ locations, each with a wordline address part 78 that can be addressed by association, and which address has four bits only in the embodiment. The table furthermore has a fault word part 80 that equals the array word length and can contain a fault map of the row that is pointed at by the address in its row address part.

The present embodiment uses a repair register 64 in FIG. 3 with a width that equals the word length of the array to indicate which columns have been set for repair so far. Finally, for each array column there is a separate counter facility 82, for counting the number of faults for the column in question. This counter may be realized as a short register. Note that the number of bit faults in a column before deciding that a redundant column is necessary, equals the number of redundant rows, which usually is in the range 2–16, so necessitating at most a four-bit register.

The on-chip processing does a partial repair analysis, based on the Must Repair strategy. The overall analysis strategy is based on the following observations. If c columns can be repaired, and a certain row i has more than c faults, these faults cannot be all repaired by columns. Hence, row i must be repaired by a spare row.

Furthermore, if r rows can be repaired, and a certain column i has more than r faults, these faults cannot be all repaired by rows. Hence, column i must be repaired by a spare column.

Now, the on-chip repair analysis operates as follows. First, the actual response pattern is bitwise compared to the expected response pattern to result in a discrepancy pattern. The discrepancy pattern is compared to a repair register that indicates the faulty columns that had been detected earlier. Only if a fault outside these columns is found, repair analysis is undertaken. Then, first the wordline address column in the table of FIG. 5 is scanned for the current wordline address. This may be effected by a conventional associative search mechanism. If the row address is not found and the table has empty space, then the actual word line address and the actual fault word are stored in the table. If the word address cannot be found, but the table is full, then the memory is beyond repair, and the test may be aborted. For simplicity, the abort mechanism has not been disclosed in detail.

However, if the word address is present in the table already, first the new fault word is ORED with the existing table entry and stored. Next, the previous table entry is subtracted from the new table word and the resulting bits are used for incrementing the respectively associated column counters in counter facility 82. If the incrementing will lead to an overflow of one or more of the counters/registers, for the bit position in question the fault bit in repair register 64 is set. This may be done expediently by ORING the counter carry bits and the existing content of the repair register.

Further to the above, a Table row that has a number of faults that exceeds the number of replaceable columns can increment the number of columns-to-be-repaired. If this number exceeds the number of redundant columns, the array is signalled as irrepairable, and the test procedure is aborted. Likewise, if the number of columns to be repaired in the repair register exceeds the number of redundant columns, the array is signalled as irrepairable, and the test procedure is aborted. If a particular memory-containing chip has more arrays in parallel, various substitution and/or higher level protective strategies could be followed, but these are outside the ambit of the present invention. The number of rows in the Table is determined as follows. A first number of row locations is used for storing faults whose rows could give rise to replacing by a redundant row. In the embodiment this comes to two locations. A second number of row locations is used for storing other faults that collectively could give rise to replacing by a redundant column. The number of these faults cannot be higher than the product of the number of redundant columns and the number of redundant rows. The two sets of row locations may form part of a single array. A reduced solution can have only the second number of row locations, inasmuch as this would cover a large fraction of all fault distributions. For example, if both numbers are equal to 16, part 80 would reduce from 272 to only 256 locations, whilst using the same analysis program strategy.

In the above, the redundant rows and/or the redundant columns may be tested in similar manner as the standard array rows and columns. This could necessitate a greater width of table part 80 and also, a greater address span of table part 78. The procedure described applies similarly to bit-organized arrays as to the word-organized array considered supra. It should be noted that interchanging rows and columns allows maintaining of the policy followed.

Hereabove, a few complications have not been treated. First, the testing is generally done on a word basis, inasmuch as the word is the unit that a computer uses for information handling. On the other hand, the memory may be organized on the basis of rows, that may comprise a plurality of words, such as in the example wherein a row is 240 bits, that may represent 15 words of 16 bits each. A bit-organized memory will then have a wordlength of only one bit. At the end of the test, the repair operation will be organized on the basis of rows and columns.

What is claimed is:

1. A built-in self-diagnostic (BISD) memory device, comprising:
   a two-dimension memory array subject to random bit faults which occur in manufacturing;
   a plurality of redundant memory rows and columns that can be substituted for various ones in the two-dimension memory array by an external repair facility;
   a test mode controller for initiating a test mode in which the memory array is probed for said random bit faults;
   a stimulus generator connected to output multi-address test sequences to the memory array during said test mode;
   a response evaluator connected to receive responses from the memory during said test mode, and able to halt the stimulus generator from progressing until an evaluation of said responses is ready;
   a fault table for storing a plurality of evaluations of said responses, and for communicating them to said external repair facility;
   a repair register disposed in the fault table, and with a word length that equals the word length of the memory array, and for indicating which memory columns have been intermediately scheduled for repair by the response evaluator;
   a plurality of column counters disposed in the fault table, and each for accumulating the number of memory bit faults detected in a respective memory column; and
   a single integrated circuit semiconductor device in which all the above elements are disposed and packaged with a limited number of input/output pins.

2. The device of claim 1, further comprising:
   a partial-repair analysis processor disposed in the response evaluator and connected to the counter, and for determining if the number of bit faults in the two-dimension memory array exceeds the capacity of the plurality of redundant memory rows and columns to effectuate a repair by their optimal substitution, and able to communicate to said repair facility if the device is unrepairable.

3. The device of claim 2, wherein:
   the partial-repair analysis processor is such that said communication to said repair facility that the device is unrepairable is issuable prior to the stimulus generator sequencing completely through the entire memory array.

4. The device of claim 2, wherein:
   the partial-repair analysis processor determines in a must-repair process if the number of faults in a particular memory row exceeds the number of redundant memory columns available, that such memory row must be repaired by substituting it with one of the redundant memory rows.

5. The device of claim 2, wherein:
   the partial-repair analysis processor determines in a must-repair process if the number of faults in a particular memory column exceeds the number of redundant memory rows available, that such memory column must be repaired by substituting it with one of the redundant memory columns.

6. The device of claim 2, wherein:
   the repair register is used to indicate faulty columns that had been detected in an earlier part of a test cycle, and a discrepancy pattern is generated from a bitwise comparison of an expected response to an actual response received from the memory array, and such discrepancy pattern is used to check if another faulty column is being newly detected, and if so a repair analysis is launched by the response evaluator in which respective column counters are incremented to determine if the device is unrepairable as indicated by a counter overflow.

* * * * *